United States Patent
Paynter et al.

(10) Patent No.: US 11,452,246 B2
(45) Date of Patent: Sep. 20, 2022

(54) PATCH SUBSTRATE CONFIGURED AS A SHIELD LOCATED OVER A CAVITY OF A BOARD

(71) Applicant: QUALCOMM Incorporated, San Diego, CA (US)

(72) Inventors: Charles David Paynter, Encinitas, CA (US); Ryan Lane, San Diego, CA (US); John Eaton, San Diego, CA (US); Amit Mano, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/071,408

(22) Filed: Oct. 15, 2020

(65) Prior Publication Data

US 2021/0307218 A1 Sep. 30, 2021

Related U.S. Application Data

(60) Provisional application No. 62/994,657, filed on Mar. 25, 2020.

(51) Int. Cl.
| | |
|---|---|
| *H05K 9/00* | (2006.01) |
| *H05K 1/02* | (2006.01) |
| *H05K 3/30* | (2006.01) |
| *H05K 5/00* | (2006.01) |
| *H05K 1/11* | (2006.01) |

(52) U.S. Cl.
CPC ......... *H05K 9/0022* (2013.01); *H05K 1/0213* (2013.01); *H05K 1/119* (2013.01); *H05K 3/30* (2013.01); *H05K 5/0017* (2013.01)

(58) Field of Classification Search
CPC .......... H05K 1/00; H05K 1/02; H05K 1/0213; H05K 1/14; H05K 1/144; H05K 3/30; H05K 9/00; H01L 25/03; H01L 25/105; H01L 25/0657; H01L 23/66; H01L 23/13; H01L 23/5386; H01L 23/5389
USPC ....................... 361/770–795, 803, 816, 818; 257/660–730
See application file for complete search history.

(56) References Cited

U.S. PATENT DOCUMENTS

| | | | |
|---|---|---|---|
| 8,018,731 B2 * | 9/2011 | Sakurai | H01L 23/5385 361/728 |
| 8,208,270 B2 * | 6/2012 | Mori | H05K 3/368 361/792 |
| 8,659,909 B2 * | 2/2014 | Searls | H01L 23/49844 361/780 |
| 2005/0168961 A1 | 8/2005 | Ono et al. | |

(Continued)

OTHER PUBLICATIONS

International Search Report and Written Opinion—PCT/US2021/023038—ISA/EPO—dated Jul. 5, 2021.

*Primary Examiner* — Tuan T Dinh
(74) *Attorney, Agent, or Firm* — Loza & Loza, LLP/Qualcomm

(57) ABSTRACT

A device that includes a board, a package and a patch substrate. The board includes a cavity. The package is coupled to a first side of the board. The package includes a substrate and an integrated device coupled to the substrate. The integrated device is located at least partially in the cavity of the board. The patch substrate is coupled to a second side of the board. The patch substrate is located over the cavity of the board. The patch substrate is configured as an electromagnetic interference (EMI) shield for the package.

23 Claims, 16 Drawing Sheets

PROFILE VIEW

(56) References Cited

U.S. PATENT DOCUMENTS

| | | | |
|---|---|---|---|
| 2005/0260867 A1* | 11/2005 | Ono | H05K 1/144 |
| | | | 439/65 |
| 2007/0096292 A1* | 5/2007 | Machida | H01L 21/4857 |
| | | | 257/E23.105 |
| 2015/0325529 A1 | 11/2015 | Choi | |
| 2016/0095218 A1 | 3/2016 | Sakurai | |
| 2019/0043847 A1 | 2/2019 | Lee et al. | |

\* cited by examiner

PROFILE VIEW

PROFILE VIEW

PROFILE VIEW

PROFILE VIEW

PROFILE VIEW

PATCH SUBSTRATE CONFIGURED AS A SHIELD LOCATED OVER A CAVITY OF A BOARD

CROSS-REFERENCE/CLAIM OF PRIORITY TO RELATED APPLICATION

The present application claims priority to and the benefit of U.S. Provisional Application No. 62/994,657, filed on Mar. 25, 2020, and titled, "PATCH SUBSTRATE CONFIGURED AS SHIELD LOCATED OVER A CAVITY OF A PRINTED CIRCUIT BOARD", which is hereby expressly incorporated by reference.

FIELD

Various features relate to packages with integrated devices, but more specifically to a package with a patch substrate configured as an electromagnetic interference (EMI) shield.

BACKGROUND

FIG. 1 illustrates a package 100 that includes a substrate 102, an integrated device 104, a passive device 106, and an encapsulation layer 108. The substrate 102 includes at least one dielectric layer 120, a plurality of interconnects 122, and a plurality of solder interconnects 124. A plurality of solder interconnects 144 is coupled to the substrate 102 and the integrated device 104. The encapsulation layer 108 encapsulates the integrated device 104, the passive device 106 and the plurality of solder interconnects 144. A shield 150 may surround the package 100. The shield 150 is configured to protect the package 100 from electromagnetic interference (EMI). The package 100 and the shield 150 may be coupled to a board 180 (e.g., printed circuit board). The shield 150 increases the overall space that is taken up in a device that includes the package 100. There is an ongoing need to improve the form factor of packages that are provided in devices.

SUMMARY

Various features relate to packages with integrated devices, but more specifically to a package with a patch substrate configured as an electromagnetic interference (EMI) shield.

One example provides a device that includes a board, a package and a patch substrate. The board includes a cavity. The package is coupled to a first side of the board. The package includes a substrate and an integrated device coupled to the substrate. The integrated device is located at least partially in the cavity of the board. The patch substrate is coupled to a second side of the board. The patch substrate is located over the cavity of the board. The patch substrate is configured as an electromagnetic interference (EMI) shield for the package.

Another example provides a device that includes a board, a package and means for patch shield. The board includes a cavity. The package is coupled to a first side of the board. The package includes a substrate and an integrated device coupled to the substrate. The integrated device is located at least partially in the cavity of the board. The means for patch shield is coupled to a second side of the board. The means for patch shield is located over the cavity of the board. The means for patch shield is configured as an electromagnetic interference (EMI) shield for the package.

Another example provides a method for fabricating a device. The method couples a package to a first side of a board comprising a cavity. The package includes a substrate and an integrated device coupled to the substrate. The integrated device is located at least partially in the cavity of the board. The method couplies a patch substrate to a second side of the board such that the patch substrate is located over the cavity of the board. The patch substrate is configured as an electromagnetic interference (EMI) shield for the package.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a board, a package and a patch substrate. The board includes a cavity. The package is coupled to a first side of the board. The package includes a substrate and an integrated device coupled to the substrate. The integrated device is located at least partially in the cavity of the board. The patch substrate is coupled to a second side of the board. The patch substrate is located over the cavity of the board. The patch substrate is configured as an electromagnetic interference (EMI) shield for the package. For example, the patch substrate may be configured as an EMI shield for the integrated device located in the cavity of the board. The board may include a printed circuit board (PCB). The patch substrate includes a plurality of shield interconnects configured as the EMI shield for the package. The plurality of shield interconnects may be coupled to ground (Vss). The patch substrate includes a plurality of interconnects configured to provide at least one electrical connection (e.g., electrical path) over the cavity of the board, and between a first portion of the board and a second portion of the board. The patch substrate provides a solution that leverages the use of the patch substrate as an EMI shield, so that a separate EMI shield is not required. Thus, the patch substrate may provide multiple functionalities for a package, which may help reduce the overall form factor and the costs for a device.

Exemplary Patch Substrate Configured as a Shield

Figure 1:
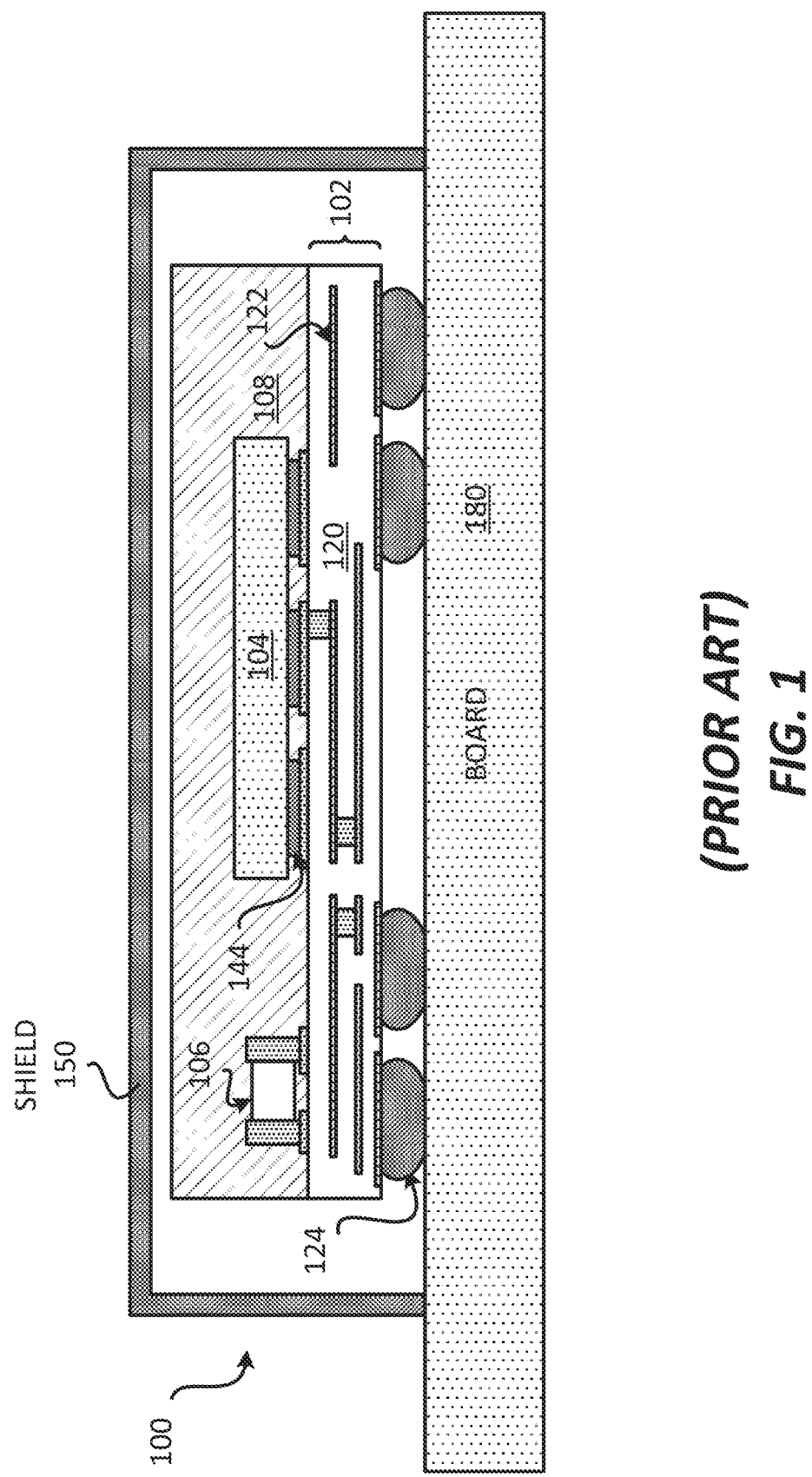
FIG. 1 illustrates a profile view of a package and a shield coupled to a printed circuit board.
Figure 2:
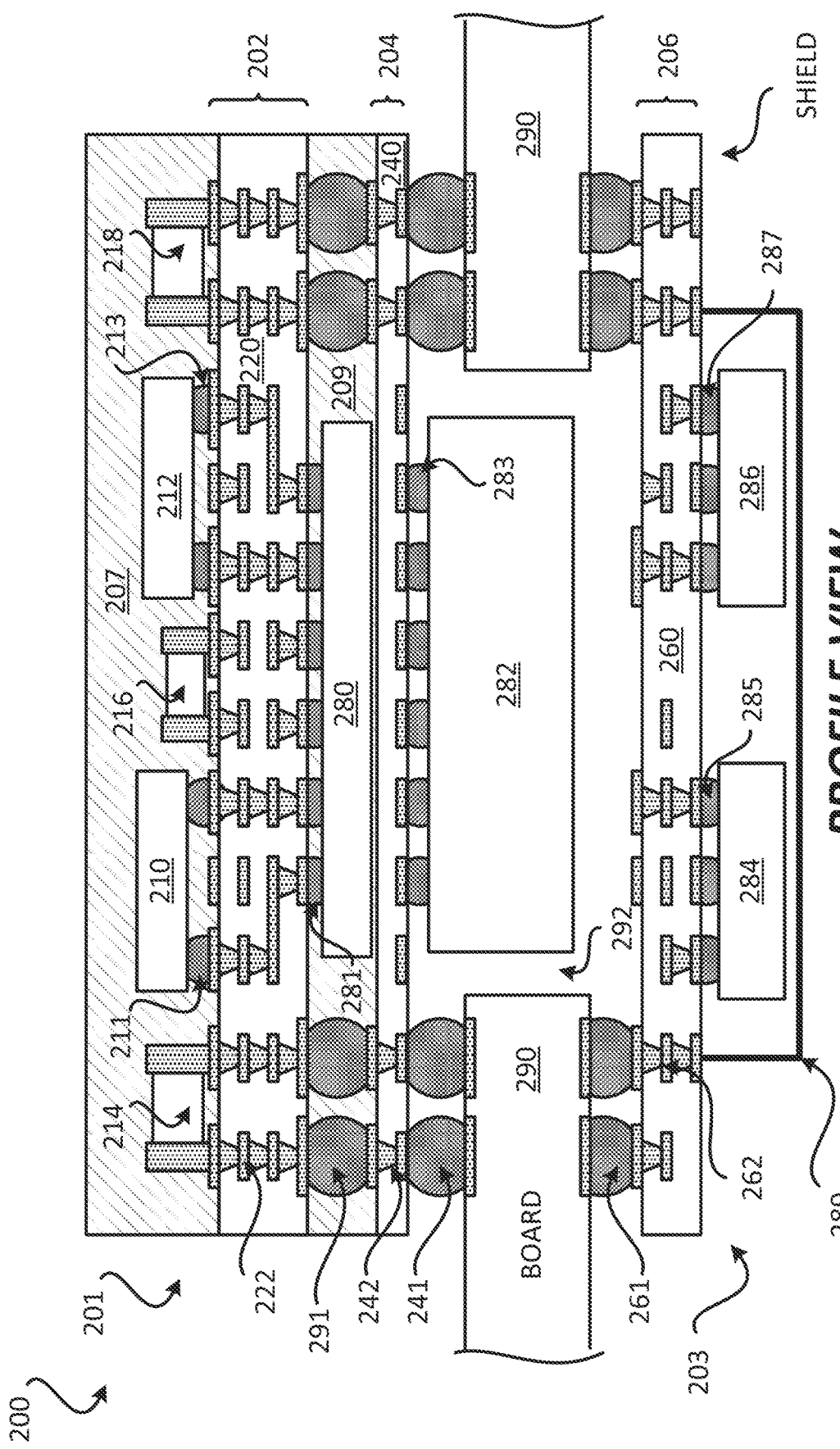
FIG. 2 illustrates a profile view of a package, a board, and a patch configured as a shield located over a cavity of board.

FIG. 2 illustrates a profile view of a device 200 that includes a patch substrate configured as an electromagnetic interference (EMI) shield. The device 200 includes a package 201, a package 203 and a board 290. The board 290 includes a cavity 292. The board 290 may include a printed circuit board (PCB). The package 201 is coupled to a first side (e.g., first surface) of the board 290. The package 203 is coupled to a second side (e.g., second surface) of the board 290.

The package 201 includes a substrate 202, a substrate 204, an integrated device 210, an integrated device 212, an integrated device 280, an integrated device 282, a passive device 214, a passive device 216, a passive device 218, an encapsulation layer 207 and an encapsulation layer 209. The package 201 is coupled to a first side (e.g., first surface) of the board 290 through a plurality of solder interconnects 241. The package 201 is located over the cavity 292 of the board 290.

The substrate 202 includes at least one dielectric layer 220 and a plurality of interconnects 222. The integrated device 210, the integrated device 212, the passive device 214, the passive device 216, and the passive device 218 are coupled to the substrate 202. The integrated device 210 is coupled to the substrate 202 through the plurality of solder interconnects 211. The integrated device 212 is coupled to the substrate 202 through the plurality of solder interconnects 213. The substrate 202 may include a laminate substrate (e.g., embedded trace substrate (ETS)). The encapsulation layer 207 is coupled to the substrate 202. The encapsulation layer 207 encapsulates the integrated device 210, the integrated device 212, the passive device 214, the passive device 216, and the passive device 218. The integrated device 280 is coupled to the substrate 202 through a plurality of solder interconnects 281.

The substrate 204 includes at least one dielectric layer 240 and a plurality of interconnects 242. An integrated device 282 is coupled to the substrate 204 through a plurality of solder interconnects 283. The substrate 204 is coupled to the substrate 202 through the plurality of solder interconnects 291. The integrated device 280 may be located between the substrate 202 and the substrate 204. An encapsulation layer 209 may located between the substrate 202 and the substrate 204. The encapsulation layer 209 may encapsulate the integrated device 280.

The package 201 may be coupled to the board 290 through the plurality of solder interconnects 241. For example, the substrate 204 may be coupled to the board 290 through the plurality of solder interconnects 241. The package 201 may be coupled to the board 290 such that the integrated device 282 is located at least partially in the cavity 292 of the board 290. The integrated device 282 includes a back side and a front side. The front side of the integrated device 282 may be coupled to the substrate 202 through the plurality of solder interconnects 283. The back side of the integrated device 282 may face the patch substrate 206. The integrated device 282 may include at least one die (e.g., memory die).

The package 203 includes a patch substrate 206, an integrated device 284 and an integrated device 286. The integrated device 284 is coupled to the patch substrate 206 through the plurality of solder interconnects 285. The integrated device 286 is coupled to the patch substrate 206 through the plurality of solder interconnects 287. The patch substrate 206 is coupled to the second side of the board 290 and is located over the cavity 292 of the board 290. The patch substrate 206 is coupled to the board 290 through a plurality of solder interconnects 261.

The patch substrate 206 includes at least one dielectric layer 260 and a plurality of interconnects 262. The plurality of interconnects 262 may include a plurality of shield interconnects and a plurality of patch interconnects. The patch substrate 206 is configured as an electromagnetic interference (EMI) shield for the package 201. For example, the patch substrate 206 may be configured as an EMI shield for the integrated device (e.g., 282) located in the cavity 292 of the board 290. The plurality of shield interconnects may be configured as the EMI shield for the package 201. The patch substrate 206 may be a means for patch shield. The plurality of shield interconnects may be configured to be coupled to ground (Vss). The patch substrate 206 includes a plurality of interconnects 262 (e.g., patch interconnects) configured to provide at least one electrical connection (e.g., electrical path) over the cavity 292 of the board 290, and between a first portion of the board 290 and a second portion of the board 290. Thus, the patch substrate 206 may be configured as a bridge between the first portion of the board 290 and the second portion of the board 290. One or more electrical signals may travel the first portion and the second portion of the board 290 through the bridge. The patch substrate 206 provides a solution that leverages the use of a substrate as an EMI shield, so that a separate EMI shield is not required. Thus, the patch substrate 206 may provide multiple functionalities for a package. For example, the patch substrate 206 may be configured (i) as an EMI shield (e.g., means for EMI shield) and (ii) as a bridge (e.g., means for bridge interconnection) over the cavity 292 and between two portions of the board 290 (providing additional routing capabilities/options that has been taken away due to the cavity 292 in the board 290). Moreover, the use of the patch substrate 206 helps reduce the overall form factor of the device, allowing the package 201, the package 203, and the board 290 to be implemented in smaller devices, such as a mobile device. The patch substrate 206 may include different numbers of metal layers.

FIG. 2 also illustrates a shield 289 that is coupled to the patch substrate 206. The shield 289 may operate as an EMI shield for the integrated device 284 and the integrated device 286. The shield 289 may include at least one sheet of metal that operates as a casing around the integrated device 284 and the integrated device 286. The shield 289 may be configured to be coupled to ground. The shield 289 may be configured to be coupled to the shield 320 (as described in at least FIGS. 3, 4 and 5). The shield 320 and/or the shield 289 may be configured to not be electrically coupled to an active device (e.g., transistor) and/or a passive device (e.g., inductor, capacitor) of the package.

The cavity 292 may have any shape, including a circular shape, a square shape, a rectangular shape, or an oval shape. The size of the cavity 292 is larger than the size of the integrated device 282 that is located at least partially in the cavity 292. In some implementations, more than one integrated device may be located at least partially in the cavity 292. In some implementations, there may be more than one cavity 292 in the board 290, and where each cavity 292 includes at least one integrated device. The substrate (e.g. 202, 204) has a lateral width and/or lateral length that is greater than the width and/or diameter of the cavity 292. Similarly, the patch substrate 206 has a lateral width and/or lateral length that is greater than the width and/or diameter of the cavity 292.

Figure 3:
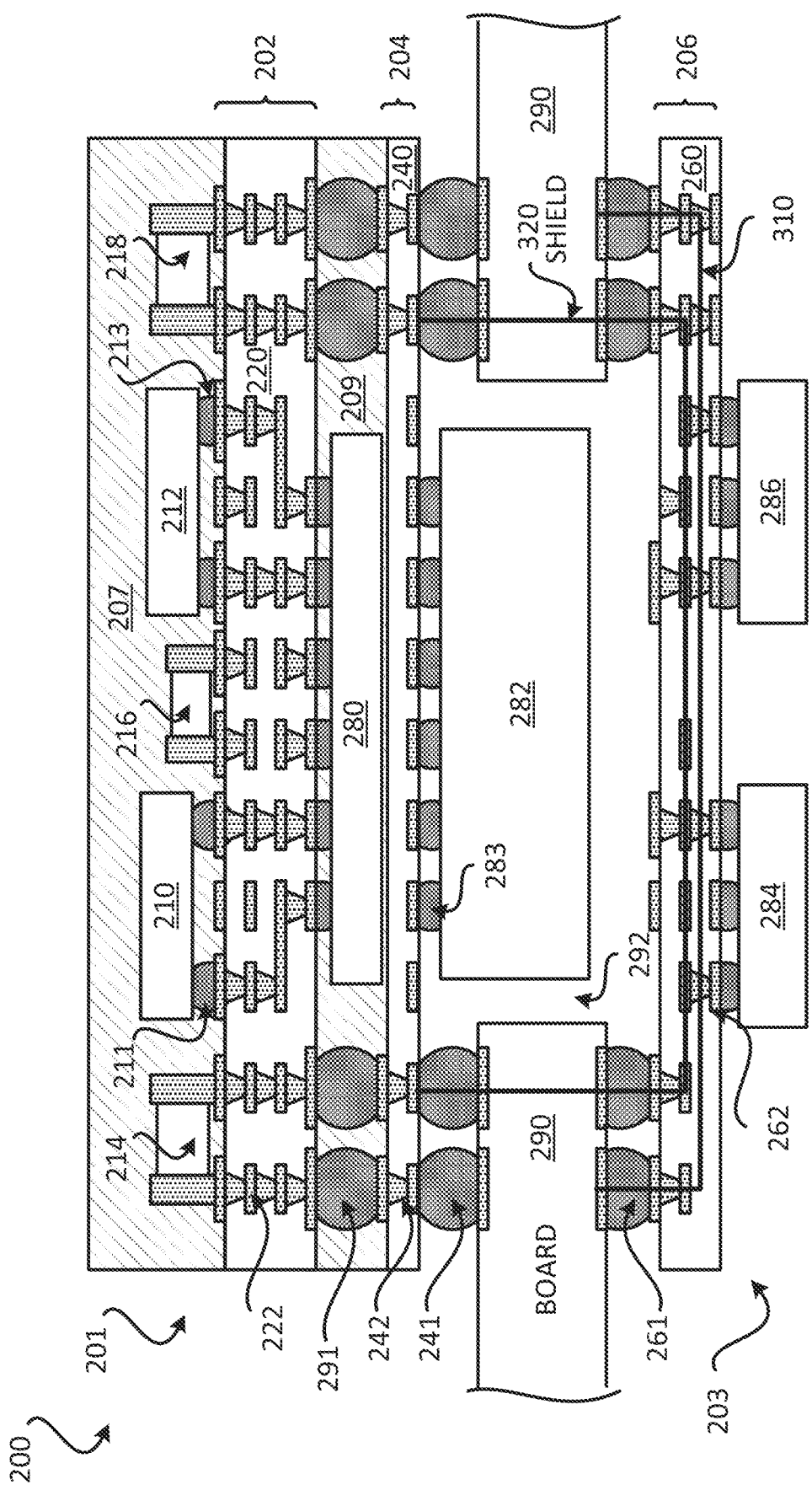
FIG. 3 illustrates a profile view of a package, a board, and a patch configured as a shield located over a cavity of board.

FIG. 3 illustrates the device 200 with conceptual and exemplary paths for electrical connections and shields in the patch substrate 206. As shown in FIG. 3, a shield 320 may be formed in at least the patch substrate 206. The shield 320 may be an EMI shield. The shield 320 shown in FIG. 3, may be a conceptual representation of an EMI shield. The shield 320 may be defined by at least one shield interconnect (or a plurality of shield interconnects) in the patch substrate 206. The shield 320 may be defined by at least one shield interconnect (or a plurality of shield interconnects) in the patch substrate 206 and at least one solder interconnect 261. The at least one shield interconnect may include interconnects from the plurality of interconnects 262. The shield 320 may be defined by at least one solder interconnect 261. The shield 320 may be defined by at least one shield interconnect (or a plurality of shield interconnects) in the patch substrate 206, at least one solder interconnect 261, at least one shield interconnect in the board 290, and/or at least one solder interconnect 241. The shield 320 may be configured to operate as a Faraday cage. The shield 320 may be coupled to ground (e.g., Vss). The shield 320 may be free of an electrical connection with an active device (e.g., transistor) of an integrated device. The shield 320 may be located over the cavity 292 of the board 290 and/or located laterally to the integrated device 282. The shape, size and/or design of the shield 320 may vary with different implementations. For example, the shield 320 may be formed on at least one metal layer of the patch substrate 206.

Figure 5:
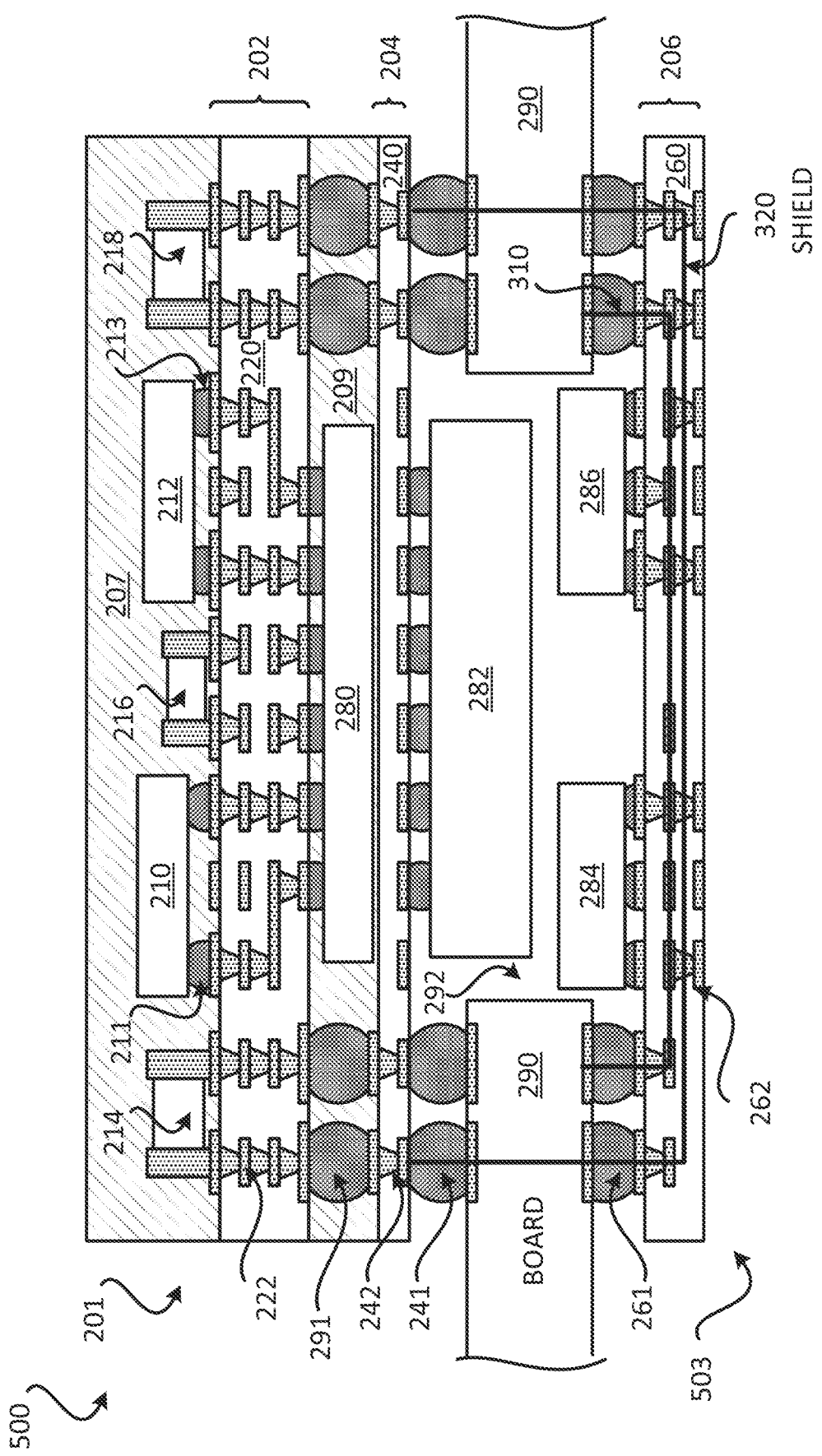
FIG. 5 illustrates a profile view of a device that includes a package, a board, and a patch configured as a shield located over a cavity of board.

FIG. 3 also illustrates at least one electrical connection 310 (e.g., electrical path) located in the patch substrate 206. The at least one electrical connection 310 shown in FIG. 3, may represent a conceptual representation of at least one possible path for at least one electrical current (e.g., signal, ground, power). The at least one electrical connection 310 may include interconnects from the plurality of interconnects 262. The at least one electrical connection 310 may include at least one solder interconnect 261. The at least one electrical connection 310 may include connections to/from the integrated device 210, the integrated device 212, the integrated device 282, the integrated device 284 and/or the integrated device 286. The patch substrate 206 is configured to provide at least one electrical connection 310 over the cavity 292 of the board 290, and between a first portion of the board 290 and a second portion of the board 290. For example, the patch substrate 206 includes a plurality of interconnects that is configured to provide at least one electrical connection 310 over the cavity 292 of the board 290, and between a first portion of the board 290 and a second portion of the board 290. The at least one electrical connection 310 may be coupled to the integrated devices 284 and/or 286. The at least one electrical connection 310 may be coupled to the at least one solder interconnect from the plurality of solder interconnects 241. The at least one electrical connection 310 may be configured to be electrically coupled to other components (e.g., integrated devices 210, 212, 280, 282) of the device 200. The locations of the shield 320 and the at least one electrical connection 310 shown in the disclosure are arbitrary. The shield 320 and the at least one electrical connection 310 may be located and/or arranged in any manner in the patch substrate 206, the board 290, the at least one solder interconnect 261 and/or the at least one solder interconnect 241. FIG. 5, which is described below, illustrates another example of how the shield 320 and the at least one electrical connection 310 may be arranged in the patch substrate 206.

Figure 4:
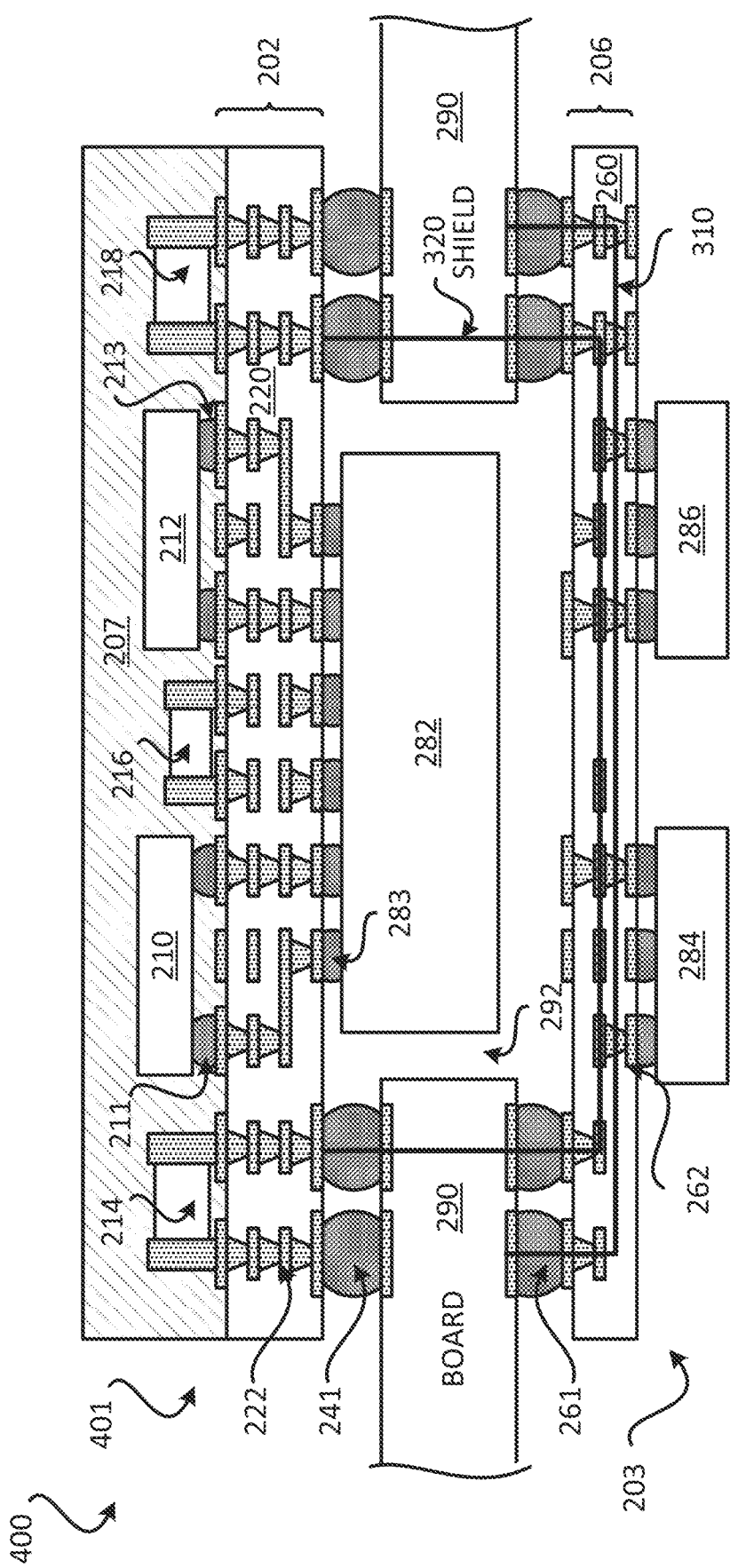
FIG. 4 illustrates a profile view of a device that includes a package, a board, and a patch configured as a shield located over a cavity of board.
Figure 6:
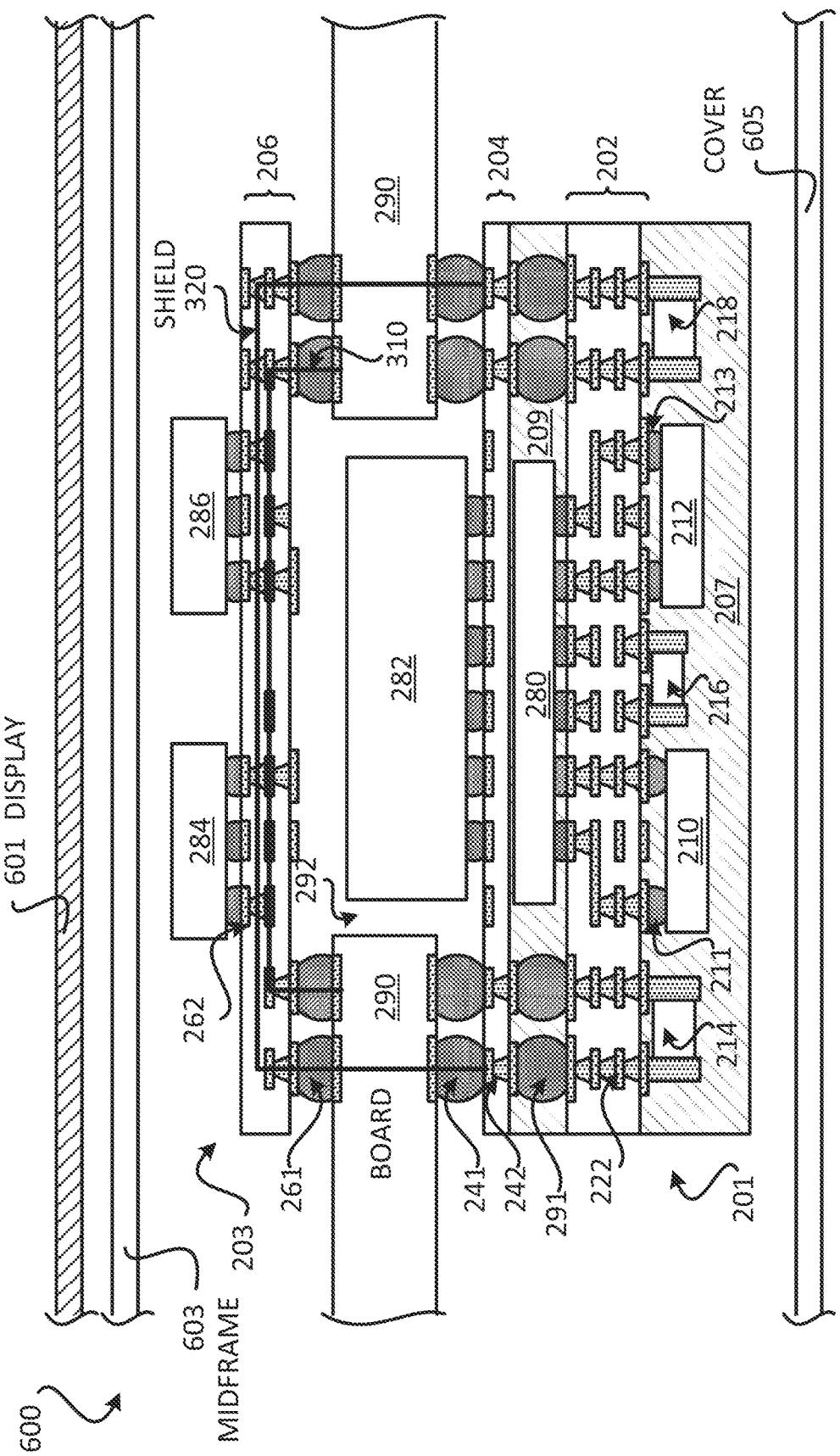
FIG. 6 illustrates a profile view of a device that includes a package, a board, and a patch configured as a shield located over a cavity of board.

Different implementations may have different configurations of the package and/or the patch substrate. FIGS. 4-6 illustrate examples of other implementations with a patch substrate.

FIG. 4 illustrates a device 400 that includes a package 401, the package 203 and the board 290. The package 401 may be similar to the package 201, and thus may include similar components as the package 201. As shown in FIG. 4, the package 401 is coupled to a first side (e.g., first surface) of the board 290 through the plurality of solder interconnects 241. For example, the substrate 202 is coupled to the first side of the board 290 through the plurality of solder interconnects 241. The package 401 includes the substrate 202. The integrated device 210, the integrated device 212, the passive device 214, the passive device 216 and the passive device 218 may be coupled to a first side of the substrate 202. The integrated device 282 is coupled to a second side of the substrate 202. The integrated device 282 may be located at least partially in the cavity 292 of the board 290.

The patch substrate 206 is configured as an electromagnetic interference (EMI) shield for the package 401. For example, the patch substrate 206 may be configured as an EMI shield for the integrated device (e.g., 282) located in the cavity 292 of the board 290. The plurality of interconnects 262 may include a plurality of shield interconnects. The plurality of shield interconnects may be configured as an EMI shield (e.g., shield 320, EMI shield for the package 401). The plurality of shield interconnects may be configured to operate as a Faraday cage. The plurality of shield interconnects may be configured to be coupled to ground (Vss). The plurality of shield interconnects may be free of an electrical connection with an active device (e.g., transistor) of an integrated device. The patch substrate 206 includes a plurality of interconnects 262 (e.g., patch interconnects) configured to provide at least one electrical connection (e.g., electrical path) over the cavity 292 of the board 290, and between a first portion of the board and a second portion of the board 290.

FIG. 5 illustrates a device 500 that includes a package 201, the package 503 and the board 290. The package 503 may be similar to the package 203, and thus may include similar components as the package 203.

The package 503 includes the patch substrate 206, the integrated device 284 and the integrated device 286. The integrated device 284 and the integrated device 286 are coupled to the patch substrate 206. The integrated device 284 and/or the integrated device 286 may face towards the package 201. For example, the back side of the integrated device 284 and/or the integrated device 286 may face the package 201. The integrated device 284 and/or the integrated device 286 may be located at least partially in the cavity 292 of the board 290. FIG. 5 also illustrates that the shield 320 is located in a different location than the shield 320 shown in FIG. 3. The location of the at least one electrical connection 310 shown in FIG. 5 is different than the location of the at least one electrical connection 310 shown in FIG. 3. As mentioned above, the sizes, shapes and/or locations of the at least one electrical connection 310 and/or the shield 320 shown in the disclosure are arbitrary.

FIG. 6 illustrates a device 600 that includes the package 201, the package 203 and the board 290. The device 600 may include a mobile device. The device 600 may include a display 601, a midframe 603 and a cover 605. The display 601 may include a screen for a mobile device. The cover 605 may include a back cover for a mobile device. The package 201, the package 203 and the board 290 is implemented inside the device 600 such that package 203 faces the display 601 and the package 201 faces the cover 605. It is noted that the device 600 may include the configurations shown in FIGS. 4-5. FIG. 6 illustrates one example of how packages, a board and a patch substrate may be implemented in a device. It is noted that other implementations may have the package, the board and/or the patch substrate configured, aligned, and/or oriented in a different manner.

The various substrates (e.g., 202, 204, 206) described in the disclosure may include different numbers of metal layers. Thus, the number of metal layers shown in the substrates is merely exemplary. The various substrates may be fabricated using the same fabrication process or different fabrication processes (e.g., ETS, SAP, mSAP). Different implementations may have different substrates. The substrates may include a core layer or may be a coreless substrate. The substrates may include a laminate substrate.

An integrated device (e.g., 210, 212, 280, 282, 284, 286) may include a die (e.g., semiconductor bare die). The integrated device may include a radio frequency (RF) device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a GaAs based integrated device a silicon carbide, a silicon (Si) based integrated device, a silicon carbide (SiC) based integrated device, a memory, power management processor, and/or combinations thereof. An integrated device (e.g., 204, 205, 206, 207) may include at least one electronic circuit (e.g., first electronic circuit, second electronic circuit, etc . . . ).

A passive device may include a capacitor and/or a resistor. The various encapsulation layers (e.g., 207, 209) may include a mold, a resin, an epoxy and/or polymer. An encapsulation layer (e.g., 207, 209) may be a means for encapsulation (e.g., first means for encapsulation, second means for encapsulation).

An encapsulation layer (e.g., 207, 209) may include a mold, a resin and/or an epoxy. The encapsulation layer (e.g., 207, 209) may be a means for encapsulation. The encapsulation layer (e.g., 207, 209) may be provided over a substrate (e.g., 202, 204) by using a compression and transfer molding process, a sheet molding process, or a liquid molding process.

Different implementations have different dimensions for the various components. In some implementations, the combined height or thickness of the package (e.g., 201, 401), the package (e.g., 203, 503) and the board 290 is approximately 3.4 millimeters (mm) or less (e.g., in a range of approximately 3.25-3.4 mm). In some implementations, the combined height or thickness of the package (e.g., 201, 401), the package (e.g., 203, 503) (with integrated device(s) on a backside of the patch substrate) and the board 290 is approximately 4.4 millimeters (mm) or less (e.g., in a range of approximately 4.0-4.4 mm). In some implementations, the board 290 may have a thickness of in a range of approximately 450-800 micrometers (μm). In some implementations, the package (e.g., 201, 401) may have a thickness of approximately 1800 micrometers or less. As mentioned above, since some of the components of the package (e.g., 201, 401) will be located in the cavity 292 of the board 290, the overall effective thickness of the package may be less. An effective thickness of the package (e.g., 201, 401) may be the thickness of package relative to the surface of the board 290 to which the package is coupled to. In some implementations, the package (e.g., 203, 503) that includes the patch substrate, may have a thickness of approximately 1000 micrometers or less. The configurations described in the disclosure allows for thinner packages or being able to pack more components, integrated devices, passive devices, substrates and/or packages in a limited amount of space of a device.

Exemplary Sequence for Fabricating a Package and a Patch Substrate Configured as a Shield FIGS. 7A-7H illustrate an exemplary sequence for providing or fabricating a package and a patch substrate. In some implementations, the sequence of FIGS. 7A-7H may be used to provide or fabricate the package and the patch substrate of FIG. 2, or any of the packages and/or patch substrates described in the disclosure.

It should be noted that the sequence of FIGS. 7A-7H may combine one or more stages in order to simplify and/or clarify the sequence for providing or fabricating the package and a patch substrate. In some implementations, the order of the processes may be changed or modified. In some implementations, one or more of processes may be replaced or substituted without departing from the spirit of the disclosure. Different implementations may fabricate an interconnect structure differently.

Figure 7A:
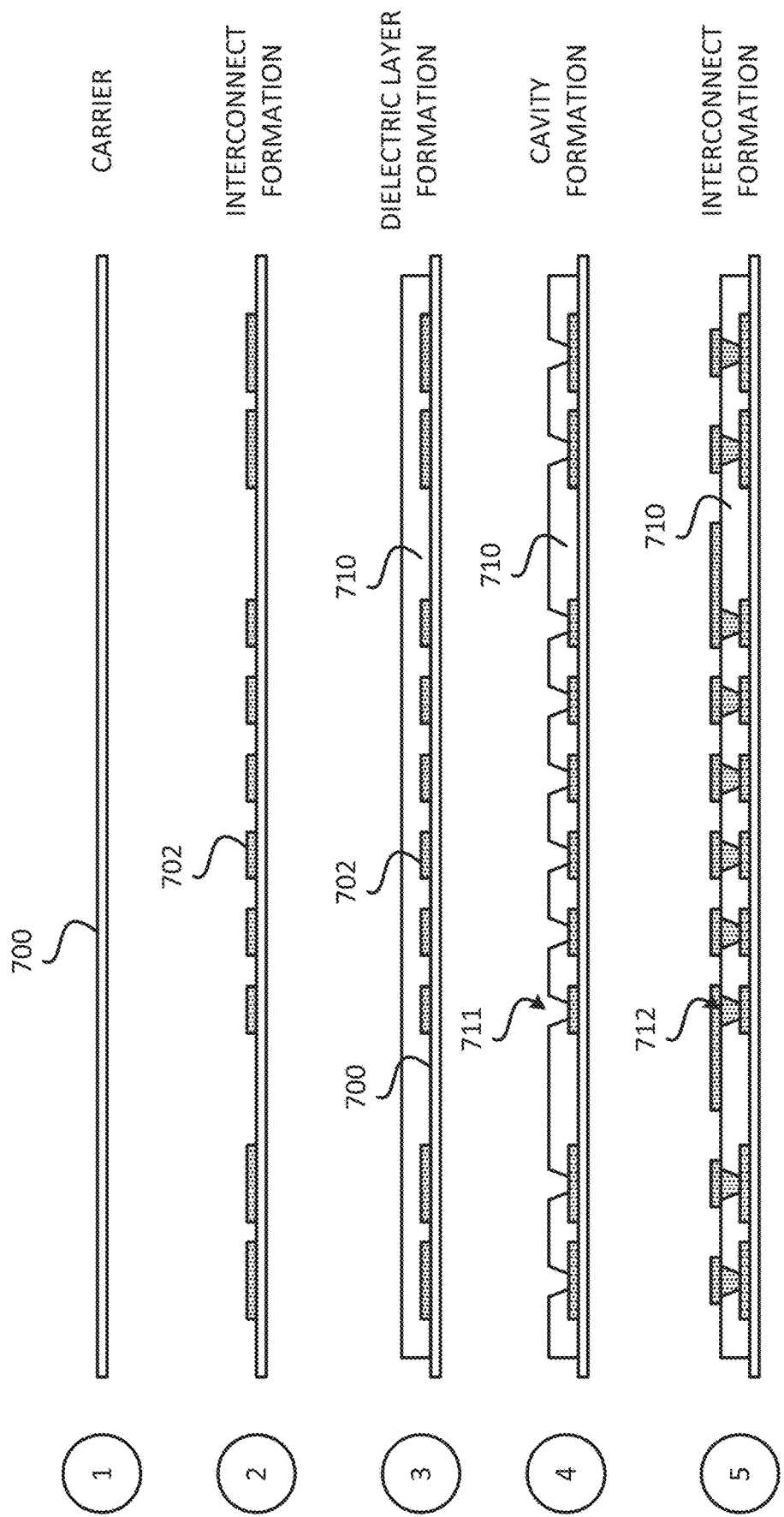
FIGS. 7A-7H illustrate an exemplary sequence for fabricating a package, a board, and a patch configured as a shield located over a cavity of board.

Stage 1, as shown in FIG. 7A, illustrates a state after a carrier 700 is provided. The carrier 700 may be a substrate and/or a wafer. The carrier 700 may include glass and/or silicon. The carrier 700 may be a first carrier.

Stage 2 illustrates a state after a plurality of interconnects 702 is formed over the carrier 700. The plurality of interconnects 702 may include traces and/or pads. Forming the plurality of interconnects 702 may include forming a seed layer, performing a lithography process, a plating process, a stripping process and/or an etching process. The plurality of interconnects 702 may be part of the plurality of interconnects 222.

Stage 3 illustrates a state after a dielectric layer 710 is formed over the plurality of interconnects 702 and the carrier 700. The dielectric layer 710 may be deposited and/or coated over the plurality of interconnects 702 and the carrier 700. The dielectric layer 710 may include polymer.

Stage 4 illustrates a state after cavities 711 are formed in the dielectric layer 710. A laser process and/or an etching process may be used to form the cavities 711.

Stage 5 illustrates a state after a plurality of interconnects 712 is formed over the dielectric layer 710 and the cavities 711. The plurality of interconnects 712 may include vias, traces and/or pads. Forming the plurality of interconnects 712 may include forming a seed layer, performing a lithography process, a plating process, a stripping process and/or an etching process. The plurality of interconnects 712 may be part of the plurality of interconnects 222.

Figure 7B:
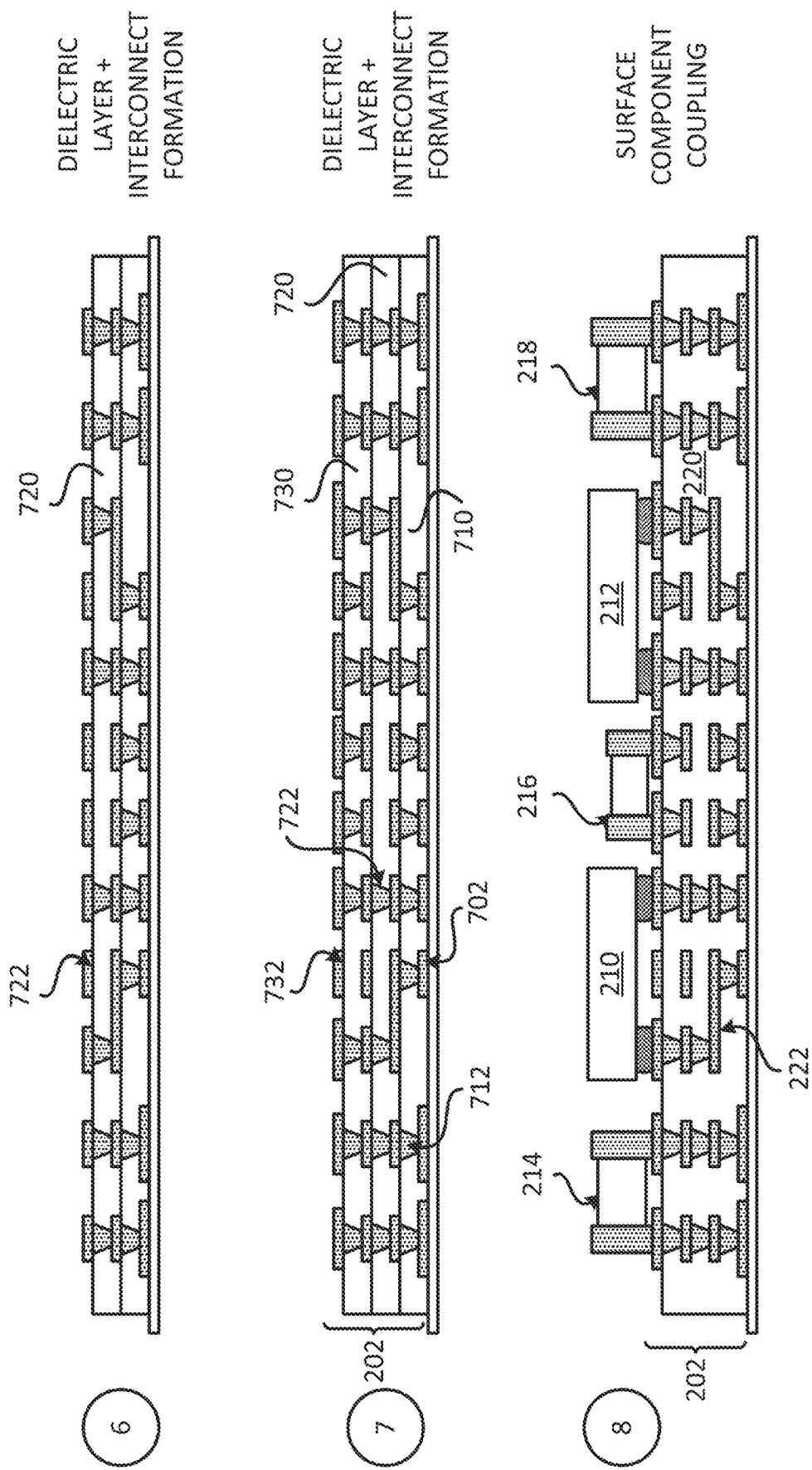

Stage 6, as shown in FIG. 7B, illustrates a state after a dielectric layer 720 and a plurality of interconnects 722 are formed over the dielectric layer 710. The dielectric layer 720 may be deposited and/or coated over the plurality of interconnects 712 and the dielectric layer 710. The dielectric layer 720 may include polymer. Forming the dielectric layer 720 may include forming cavities in the dielectric layer 720.

A laser process and/or an etching process may be used to form the cavities in the dielectric layer 720. The plurality of interconnects 722 may include vias, traces and/or pads. Forming the plurality of interconnects 722 may include forming a seed layer, performing a lithography process, a plating process, a stripping process and/or an etching process. The plurality of interconnects 722 may be part of the plurality of interconnects 222.

Stage 7 illustrates a state after a dielectric layer 730 and a plurality of interconnects 732 are formed over the dielectric layer 720. The dielectric layer 730 may be deposited and/or coated over the plurality of interconnects 722 and the dielectric layer 720. The dielectric layer 730 may include polymer. Forming the dielectric layer 730 may include forming cavities in the dielectric layer 730. A laser process and/or an etching process may be used to form the cavities in the dielectric layer 730. The plurality of interconnects 732 may include vias, traces and/or pads. Forming the plurality of interconnects 732 may include forming a seed layer, performing a lithography process, a plating process, a stripping process and/or an etching process. The plurality of interconnects 732 may be part of the plurality of interconnects 222. Stage 7 may illustrate the substrate 202 that includes the dielectric layers (710, 720, 730) and the plurality of interconnects (e.g., 702, 712, 722, 732).

Stage 8 illustrates a state after a plurality of integrated devices (e.g., 210, 212) and a plurality of passive devices (e.g., 214, 216, 218) are coupled to a first surface of the substrate 202. The substrate 202 includes at least one dielectric layer 220 and a plurality of interconnects 222. The at least one dielectric layer 220 may represent the dielectric layers 710, 720 and/or 730. The plurality of interconnects 222 may represent the plurality of interconnects 702, 712, 722 and/or 732. A pick and place process may be used to place the passive devices and integrated device over the first surface of the substrate 202. Solder interconnects (e.g., 211, 213) may be used to couple the passive devices (e.g., 214, 216, 218) and the integrated devices (e.g., 210, 212) to the substrate 202 (e.g., interconnects of the substrate 202). A reflow solder process may be used to couple the passive devices and the integrated devices to the substrate 202.

Figure 7C:
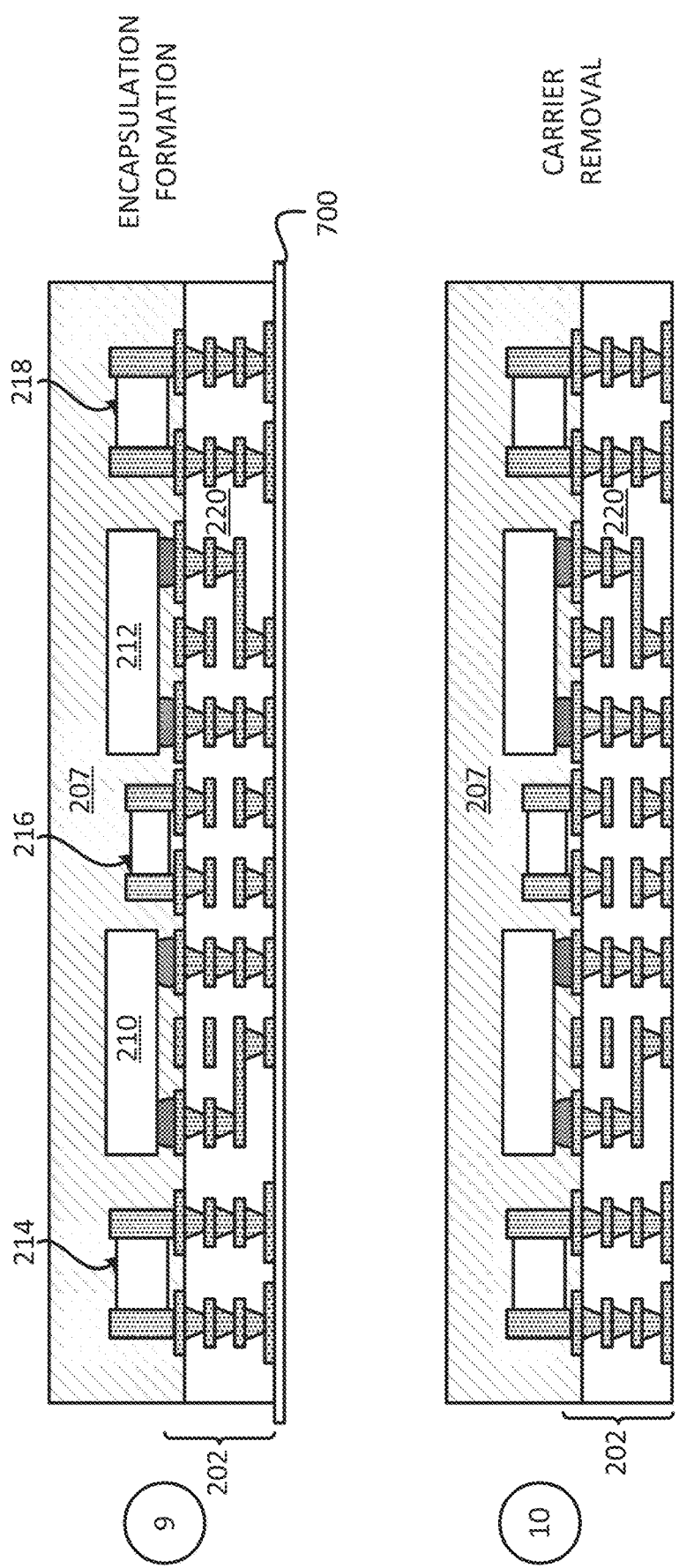

Stage 9, as shown in FIG. 7C, illustrates a state after an encapsulation layer 207 is formed over the first surface of the substrate 202 such that the encapsulation layer 207 encapsulates the passive devices (e.g., 214, 216, 218) and the integrated devices (e.g., 210, 212). The encapsulation layer 207 may be coupled to the first surface of the substrate 202. The process of forming and/or disposing the encapsulation layer 207 may include using a compression and transfer molding process, a sheet molding process, or a liquid molding process.

Stage 10 illustrates a state after the carrier 700 is decoupled from the substrate 202. The carrier 700 may be decoupled through a grinding process and/or peel off process.

Figure 7D:
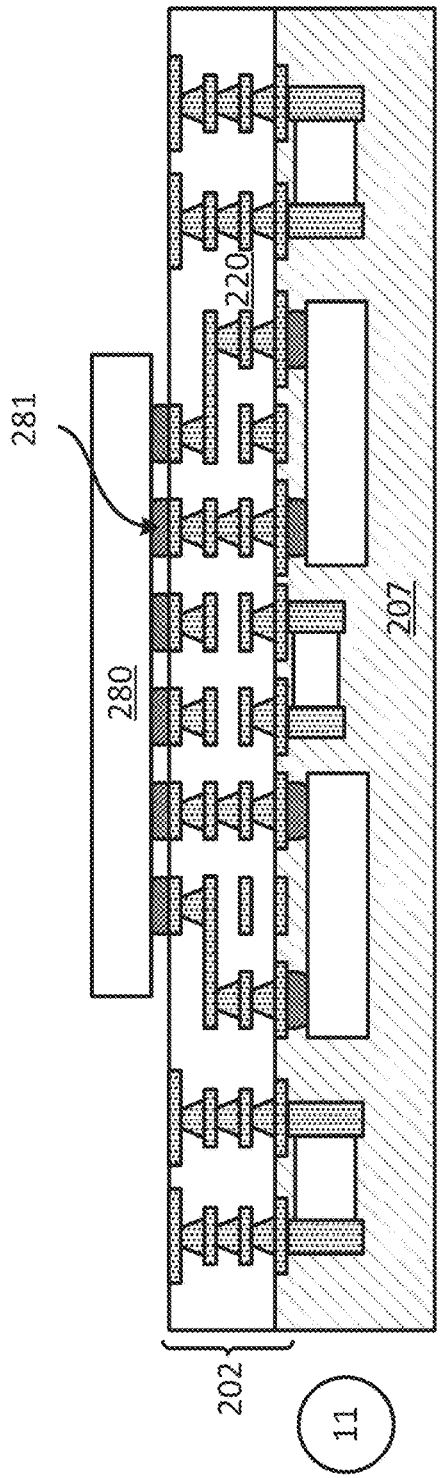
Figure 7D:
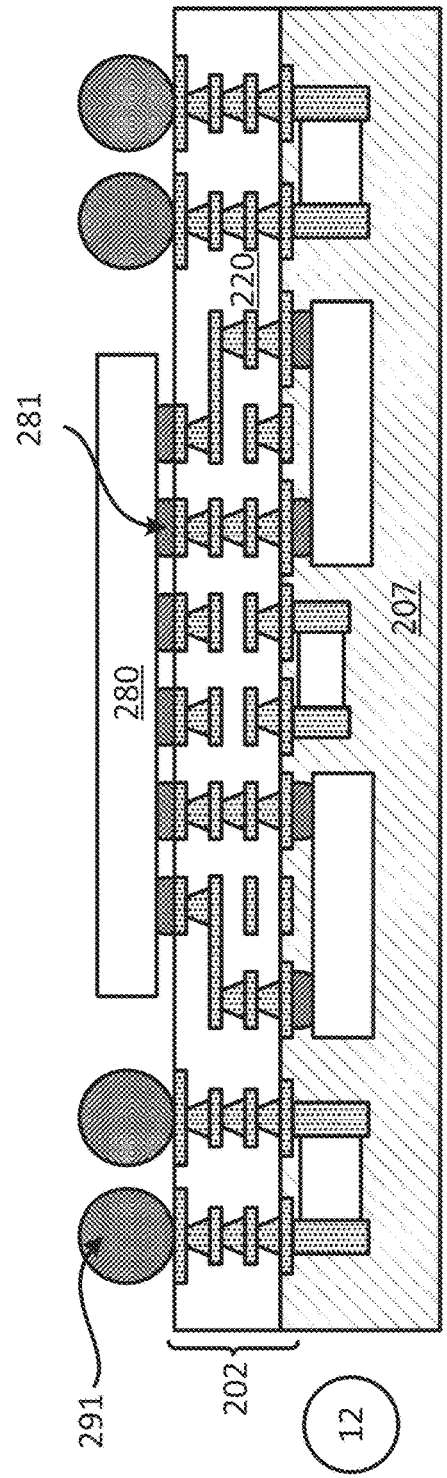

Stage 11, as shown in FIG. 7D, illustrates a state after the integrated device 280 is coupled to a second surface of the substrate 202. The integrated device 280 is coupled to the substrate 202 through the plurality of solder interconnects 281. A reflow solder process may be used to couple the integrated device 280 to the substrate 202.

Stage 12 illustrates a state after the plurality of solder interconnects 291 is coupled to the second surface of the substrate 202 (e.g., interconnects of the substrate 202). A reflow solder process may be used to couple the plurality of solder interconnects 291 to the substrate.

Figure 7E:
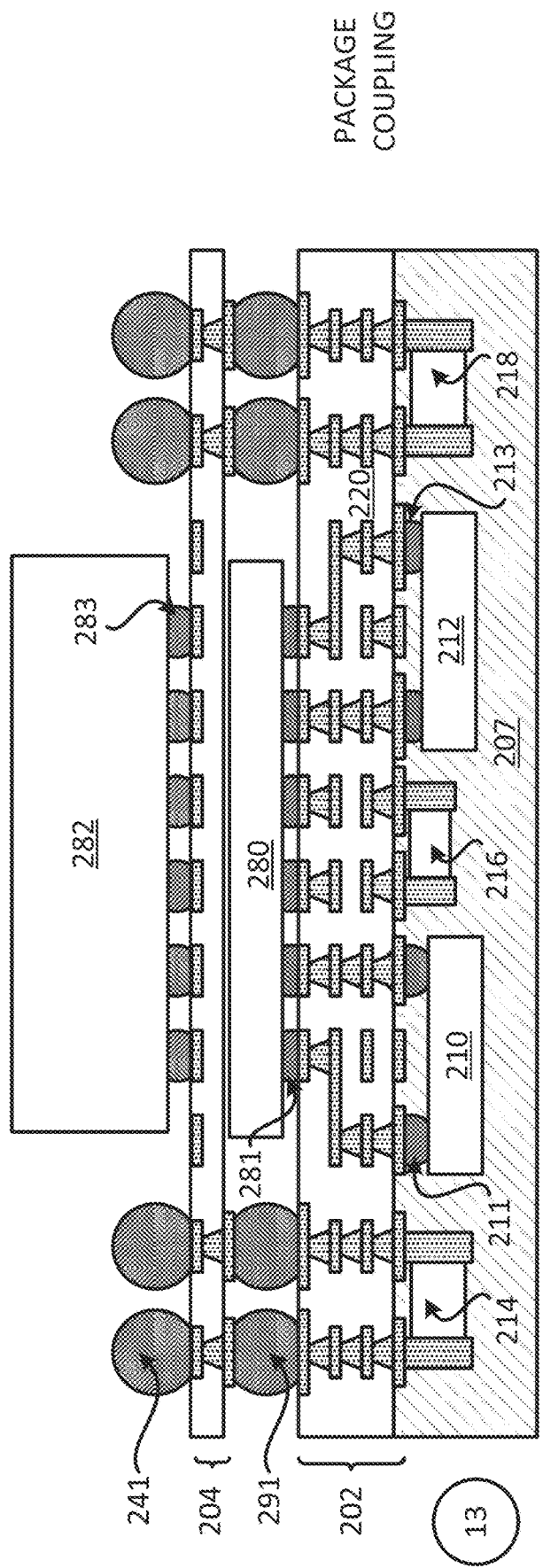

Stage 13, as shown in FIG. 7E, illustrates a state a package that includes a substrate 204 and an integrated device 282 is coupled to the plurality of solder interconnects 291. For example, the substrate 204 may be coupled to the plurality of solder interconnects 291. The integrated device 282 may be coupled to the substrate 204 through a plurality of solder interconnects 283. The substrate 204 may include at least one dielectric layer 240 and a plurality of interconnects 242. At least one reflow solder process may be used to couple (i) the integrated device 282 to the substrate 204 (through the solder interconnects 283) and (ii) the substrate 204 to the substrate 202 (through the solder interconnects 291)

Figure 7F:
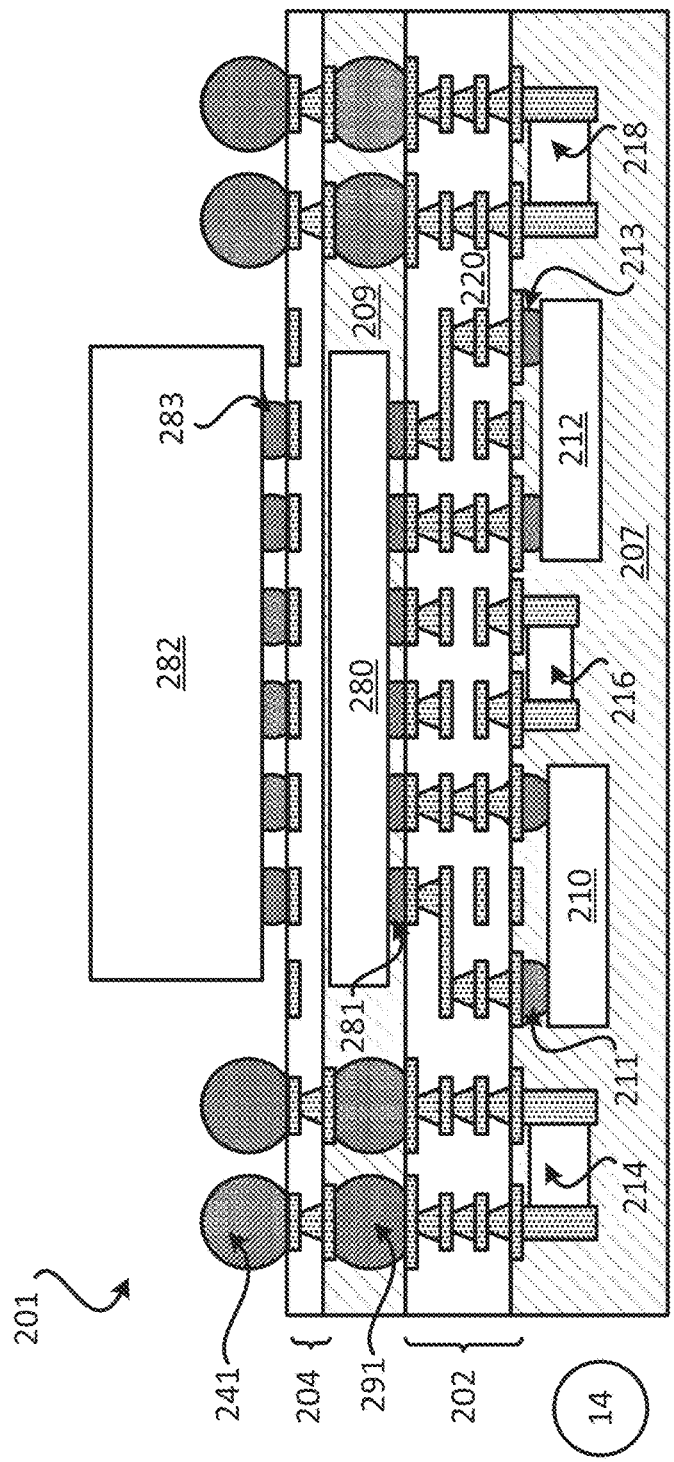

Stage 14, as shown in FIG. 7F, illustrates a state after an encapsulation layer 209 is formed between the substrate 202 and the substrate 204. The encapsulation layer 209 may encapsulate the integrated device 282. The process of forming and/or disposing the encapsulation layer 209 may include using a compression and transfer molding process, a sheet molding process, or a liquid molding process. Stage 14 may illustrate the package 201, as described in FIG. 2.

Figure 7G:
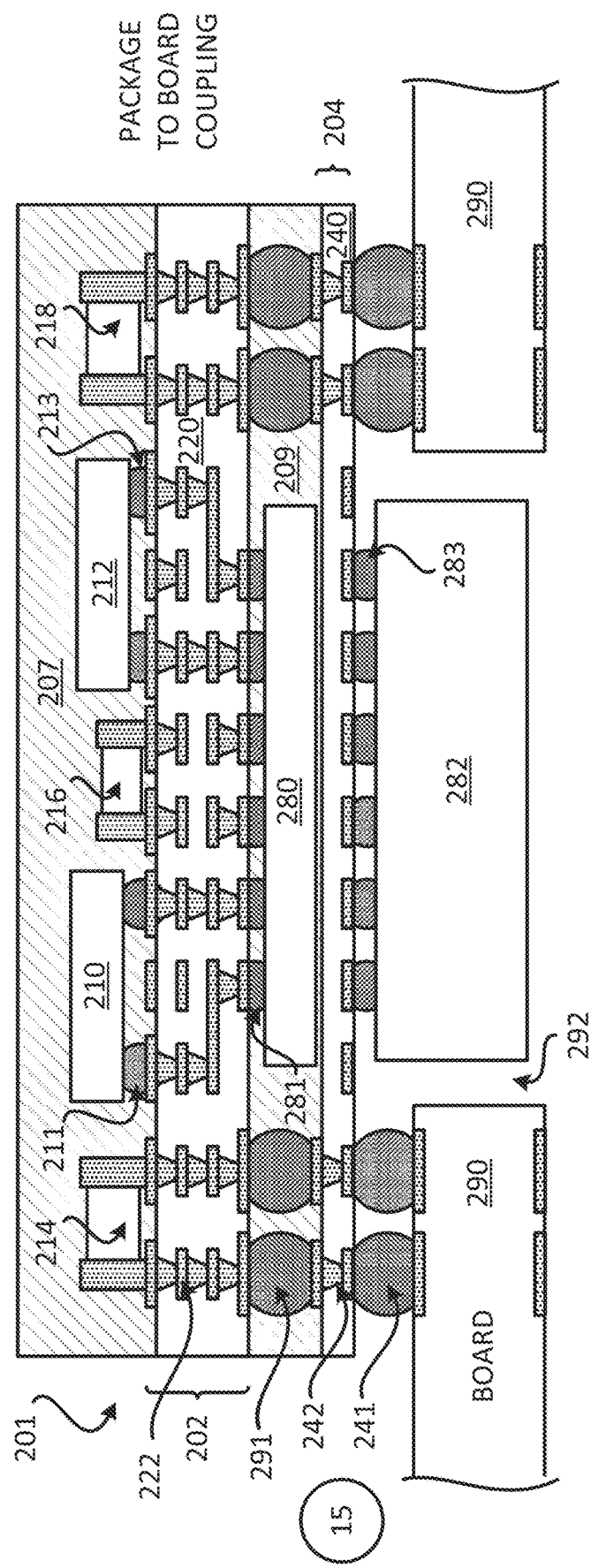

Stage 15, as shown in FIG. 7G, illustrates a state after the package 201 is coupled to a first side (e.g., first surface) of the board 290. The package 201 is coupled to the board 290 through the plurality of solder interconnects 241. The integrated device 282 is located at least partially in the cavity 292 of the board 290. A reflow solder process may be used to couple the package 201 to the board 290 such that the integrated device 282 is located at least partially in the cavity 292 of the board 290.

Figure 7H:
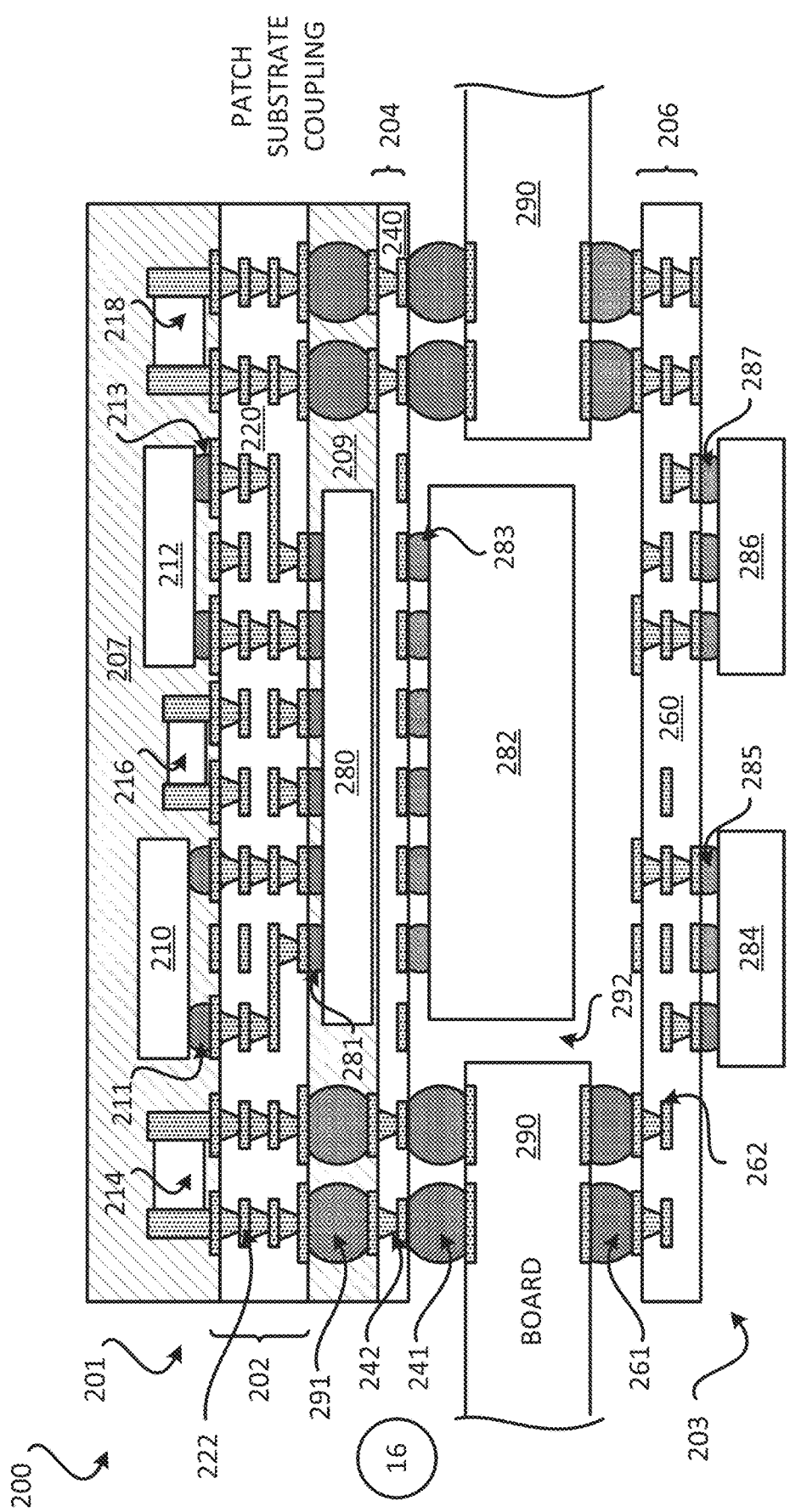

Stage 16, as shown in FIG. 7H, illustrates a state after the package 203 is coupled to a second side (e.g., second surface) of the board 290. The package 203 is coupled to the board 290 through the plurality of solder interconnects 261. The package 203 includes a patch substrate 206, the integrated device 284 and the integrated device 286. The patch substrate 206 is coupled to the second side of the board 290 and is located over the cavity 292 of the board 290. The patch substrate 206 is coupled to the board 290 through a plurality of solder interconnects 261. A reflow solder process may be used to couple the package 203 to the board 290. The patch substrate 206 may be fabricated in a similar manner as described for the substrate 202. For example, stages 1-7 as described in FIGS. 7A-7B may be used to fabricate the patch substrate 206. However, the patch substrate 206 may be fabricated differently. The package 203 may be fabricated in a similar manner as described for the package 201. The package 201, the package 203 and the board 290 may be implemented in a device, such as a mobile device that includes a display and a cover.

It is noted that the process of fabricating the device, the package(s), the substrate(s), the board(s), the integrated device(s), and the passive device(s) may be fabricated by one or more fabricators, manufacturers, suppliers and/or assemblers. In one example, (i) the substrates may be fabricated, (ii) the fabricated substrates are then provided to be assembled as packages by coupling the substrates to integrated devices and/or passive devices, (iii) the packages are assembled/coupled to a board that includes a cavity, and (iv) the assembled board and packages are then implemented in a device. The above is merely an example of how devices, packages, substrates, integrated devices and/or passives may be assembled and implemented in a device. Other implementations may have a different order, and/or be implemented by different fabricators, manufacturers, suppliers and/or assemblers.

Figure 8:
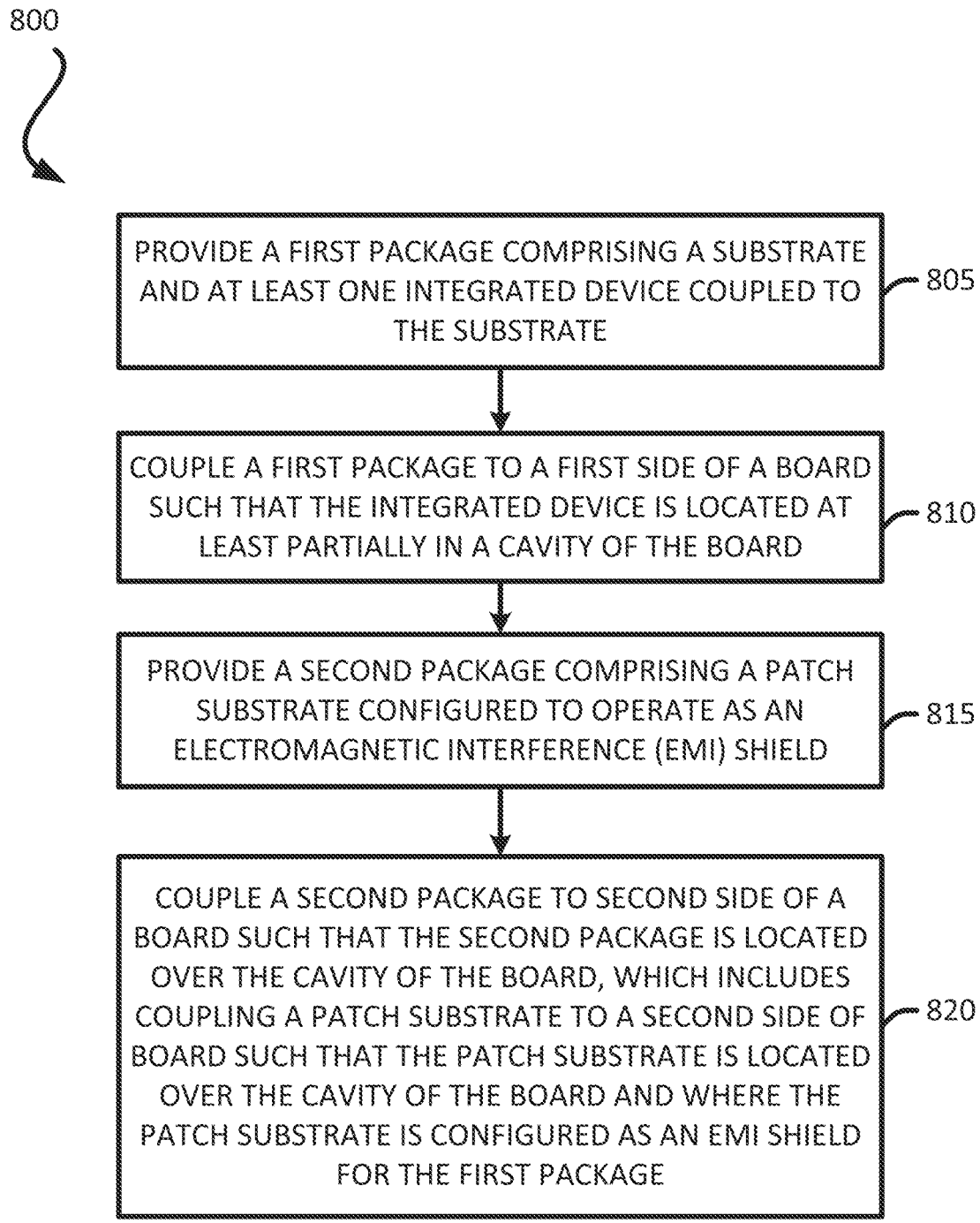
FIG. 8 illustrates an exemplary flow diagram of a method for fabricating a package, a board, and a patch configured as a shield located over a cavity of board.

Exemplary Flow Diagram of a Method for Fabricating a Package and a Patch Substrate Configured as a Shield In some implementations, fabricating a package and a patch substrate several processes. FIG. 8 illustrates an exemplary flow diagram of a method 800 for providing or fabricating a package and a patch substrate. In some implementations, the method 800 of FIG. 8 may be used to provide or fabricate the package and the patch substrate of FIG. 2 described in the disclosure. However, the method 800 may be used to provide or fabricate any of the packages and/or patch substrates described in the disclosure.

It should be noted that the method of FIG. 8 may combine one or more processes in order to simplify and/or clarify the method for providing or fabricating a package and a patch substrate. In some implementations, the order of the processes may be changed or modified.

The method provides (at 805) a first package (e.g., 201, 401) that includes at least one substrate (e.g., 202, 204) and at least one integrated device (e.g., 210, 212, 280, 282). The first package may be provided by a supplier or fabricated. The first package may also include at least one encapsulation layer (e.g., 207, 209). Stages 1-14 of FIGS. 7A-7F illustrate an example of a fabrication of a package that includes at least one substrate and at least one integrated device.

The method couples (at 810) the first package to a first side (e.g., first surface) of a board (e.g., 290) such that the integrated device (e.g., 282) of the first package (e.g., 201, 401) is located at least partially in a cavity (e.g., 292) of the board (e.g., 290). The first package may be coupled to the board through a plurality of solder interconnects. A reflow solder process may be used to couple the first package to the board. Stage 15 of FIG. 7G illustrates an example of a package that is coupled to board.

The method provides (at 815) a second package (e.g., 203, 503) that includes a patch substrate (e.g., 206) that is configured to operate as an electromagnetic interference (EMI) shield. The second package may be provided by a supplier or fabricated. The second package may be fabricated using a similar process as the first package. Thus, the second package may be fabricated using a process similar to stages 1-8 of FIGS. 7A-7B.

The method couples (at 820) the second package (e.g., 203, 503) to a second side of the board (e.g., 290) such that the second package is located over the cavity (e.g., 292) of the board. The second package includes a patch substrate (e.g., 206) that is configured to operate as an EMI shield. The patch substrate may include at least one shield interconnect that is configured as an EMI shield. The patch substrate may be located over the cavity of the board. Stage 16 of FIG. 7H illustrates an example of a package that includes a patch substrate coupled to a board.

Exemplary Electronic Devices

Figure 9:
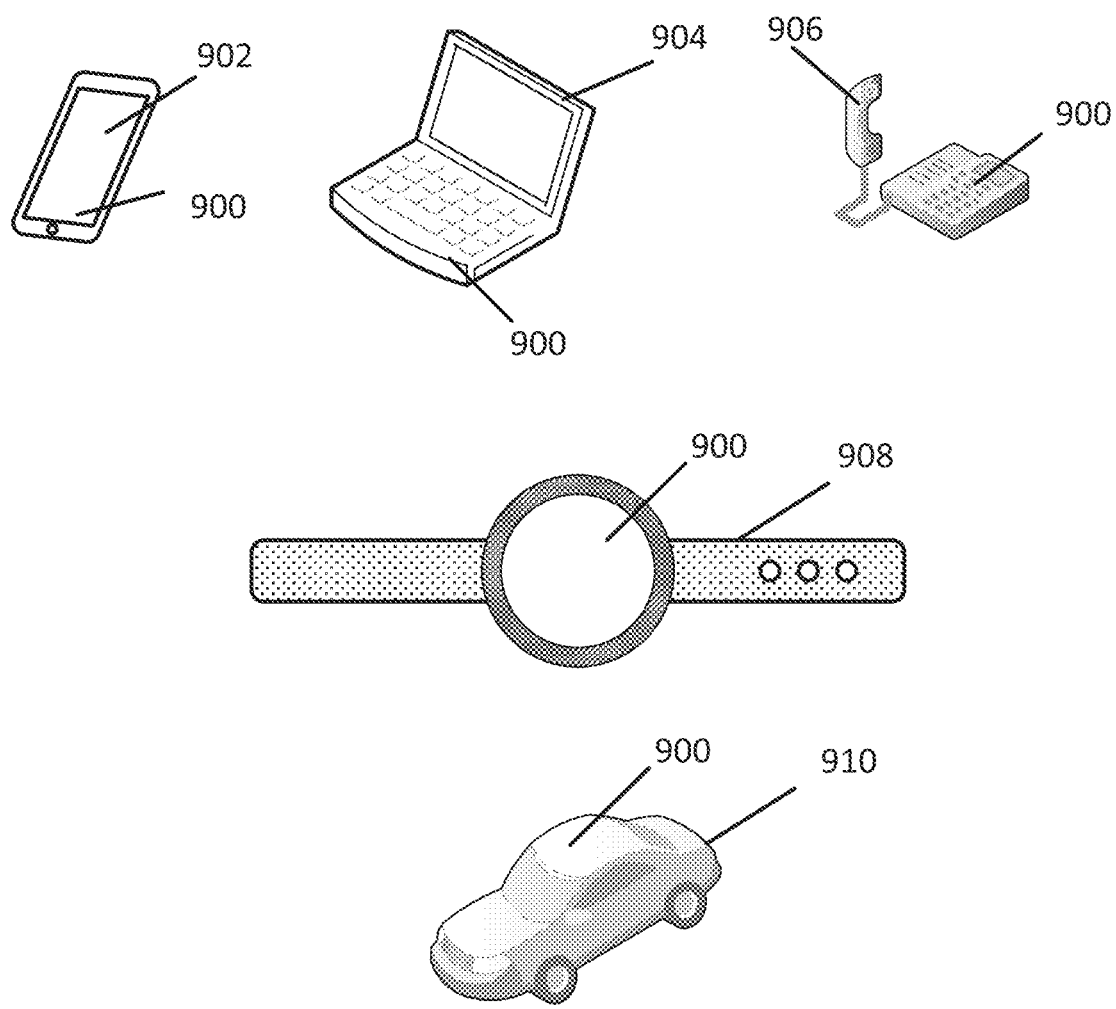
FIG. 9 illustrates various electronic devices that may integrate a die, an integrated device, an integrated passive device (IPD), a passive component, a package, and/or a device package described herein.

FIG. 9 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 902, a laptop computer device 904, a fixed location terminal device 906, a wearable device 908, or automotive vehicle 910 may include a device 900 as described herein. The device 900 may be, for example, any of the devices and/or integrated circuit (IC) packages described herein. The devices 902, 904, 906 and 908 and the vehicle 910 illustrated in FIG. 9 are merely exemplary. Other electronic devices may also feature the device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-6, 7A-7H, and/or 8-9 may be rearranged and/or combined into a single component, process, feature or function or embodied in several components, processes, or functions. Additional elements, components, processes, and/or functions may also be added without departing from the disclosure. It should also be noted FIGS. 2-6, 7A-7H, and/or 8-9 and its corresponding description in the present disclosure is not limited to dies and/or ICs. In some implementations, FIGS. 2-6, 7A-7H, and/or 8-9 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
   a board comprising a cavity;
   a package coupled to a first side of the board, the package comprising:
      a substrate; and
      an integrated device coupled to the substrate, wherein the integrated device is located at least partially in the cavity of the board; and
   a patch substrate coupled to a second side of the board,
      wherein the patch substrate is located over the cavity of the board, and
      wherein the patch substrate is configured as an electromagnetic interference (EMI) shield for the package,
      wherein the patch substrate includes a plurality of shield interconnects that are configured as an EMI shield for the integrated device, and
      wherein the plurality of shield interconnects that are configured as the EMI shield for the integrated device include at least one shield interconnect that is located over a back side of the integrated device.

2. The device of claim 1, wherein the board is configured to be part of the EMI shield for the integrated device located in the cavity of the board.

3. The device of claim 1,
   wherein the board includes another plurality of shield interconnects that is configured to be part of the EMI shield for the integrated device located in the cavity of the board,
   wherein the patch substrate is coupled to the board through a plurality of solder interconnects, and
   wherein at least one solder interconnect from the plurality of solder interconnects is configured to be part of the EMI shield for the integrated device.

4. The device of claim 1, wherein the patch substrate is further configured as a bridge that provides at least one electrical connection over the cavity of the board, and between a first portion of the board and a second portion of the board.

5. The device of claim 1, wherein the patch substrate includes a plurality of interconnects that is configured to provide at least one electrical connection over the cavity of the board, and between a first portion of the board and a second portion of the board.

6. The device of claim 1, further comprising a second integrated device coupled to the patch substrate.

7. The device of claim 1, wherein the integrated device includes a memory die.

8. The device of claim 1, further comprising:
   a display; and
   a cover,
      wherein the board and the patch substrate are located in the device such that the patch substrate is located closer to the display.

9. The device of claim 1, wherein a combined thickness of the package, the board and the patch substrate is approximately 3.4 millimeters (mm) or less.

10. The device of claim 1, wherein the device is incorporated into a particular device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. The device of claim 6, wherein the second integrated device is configured to be electrically coupled to the integrated device through at least the patch substrate, the board and the substrate.

12. An apparatus comprising:
a printed circuit board comprising a cavity;
a package coupled to a first side of the printed circuit board, the package comprising: a substrate; and an integrated device coupled to the substrate,
wherein the integrated device is located at least partially in the cavity of the printed circuit board; and
means for patch shield coupled to a second side of the printed circuit board,
wherein the means for patch shield includes a plurality of shield interconnects that are configured as an electromagnetic interference (EMI) shield for the integrated device located at least partially in the cavity of the printed circuit board,
wherein at least a portion of the means for patch shield is located over the cavity of the printed circuit board such that the integrated device is located between the substrate and the means for patch shield, and
wherein the means for patch shield is configured as the EMI shield over a back side of the integrated device of the package.

13. The apparatus of claim 12, wherein the means for patch shield further includes a means for bridge interconnection that is configured to provide at least one electrical connection over the cavity of the printed circuit board, and between a first portion of the printed circuit board and a second portion of the printed circuit board.

14. The apparatus of claim 12, wherein the means for patch shield includes a plurality of interconnects that is configured to provide at least one electrical connection over the cavity of the printed circuit board, and between a first portion of the printed circuit board and a second portion of the printed circuit board.

15. The apparatus of claim 12, further comprising a second integrated device coupled to the means for patch shield.

16. The apparatus of claim 12, wherein the integrated device includes a memory die.

17. The apparatus of claim 12, further comprising:
a display; and
a cover,
wherein the printed circuit board and the means for patch shield are located in the apparatus such that the means for patch shield is located closer to the display.

18. The apparatus of claim 12, wherein the apparatus is incorporated into a particular device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

19. The apparatus of claim 15, wherein the second integrated device is configured to be electrically coupled to the integrated device through at least the means for patch shield, the printed circuit board and the substrate.

20. A method for fabricating a device comprising:
coupling a package to a first side of a board comprising a cavity, the package comprising:
a substrate; and
an integrated device coupled to the substrate, wherein the integrated device is located at least partially in the cavity of the board; and
coupling a patch substrate to a second side of the board such that the patch substrate is located over the cavity of the board, wherein the patch substrate is configured as an electromagnetic interference (EMI) shield for the package,
wherein the patch substrate includes a plurality of shield interconnects that are configured as an EMI shield for the integrated device, and
wherein the plurality of shield interconnects that are configured as the EMI shield for the integrated device include at least one shield interconnect that is located over a back side of the integrated device.

21. The device of claim 20, wherein the board is configured as part of the EMI shield for the integrated device located in the cavity of the board.

22. The device of claim 20,
wherein the board includes another plurality of shield interconnects that is configured to be part of the EMI shield for the integrated device located in the cavity of the board,
wherein the patch substrate is coupled to the board through a plurality of solder interconnects, and
wherein at least one solder interconnect from the plurality of solder interconnects is configured to be part of the EMI shield for the integrated device.

23. The device of claim 20, wherein the patch substrate is configured as a bridge that provides at least one electrical connection over the cavity of the board, and between a first portion of the board and a second portion of the board.

* * * * *